United States Patent [19]

Buckley

[11] Patent Number: 4,495,585
[45] Date of Patent: Jan. 22, 1985

[54] METHOD OF AND APPARATUS FOR INDICATING CHARACTERISTICS OF UNDULATING DATA

[76] Inventor: William H. Buckley, 15308 Emory La., Rockville, Md. 20853

[21] Appl. No.: 281,302

[22] Filed: Jul. 8, 1981

[51] Int. Cl.³ .............................................. G01R 23/16
[52] U.S. Cl. ..................... 364/487; 340/706; 340/754; 364/514; 382/18; 382/29
[58] Field of Search ............... 364/487, 550, 514, 522; 340/753–755, 784, 706, 722; 382/18, 29; 367/28–30, 68

[56] References Cited
U.S. PATENT DOCUMENTS 3,968,499  7/1976  Lowe et al. ............................ 367/29
4,142,146  2/1979  Schumann et al. ................. 364/487

OTHER PUBLICATIONS

Article, "American Society for Testing and Materials", 1979, pp. 5–20, written by Otto Buxbaum, entitled "Randon Load Analysis as a Link Between Operational Stress Measurement and Fatigue Life Assessment."

Primary Examiner—Edward J. Wise
Attorney, Agent, or Firm—Lowe, King, Price & Becker

[57] ABSTRACT

Characteristics of undulating data having variations with oppositely directed peaks are displayed on a display having x and y axes. The consecutive, oppositely directed peak values of each variation are determined. Each variation is assigned to a coordinate positon on the display so that the coordinate position in the x and y directions is respectively determined by the initial and final peak values of each variation. The variations having like initial and final peak values are accumulated so an indication of the accumulated variations is displayed on the coordinate positions of the display.

51 Claims, 9 Drawing Figures

Fig. 3

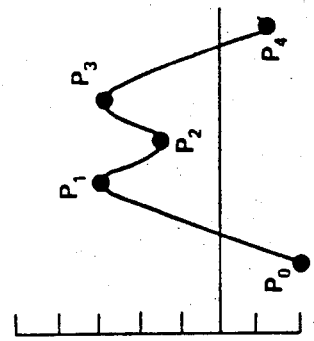
CASE 1. $|P_1|^* > |P_3|^*$
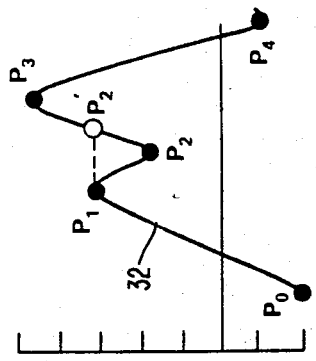
CASE 2. $|P_1|^* < |P_3|^*$
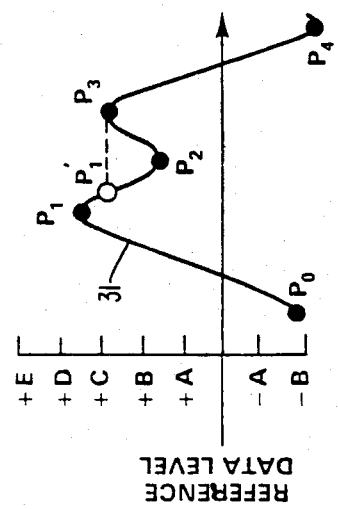
CASE 3. $|P_1|^* = |P_3|^*$
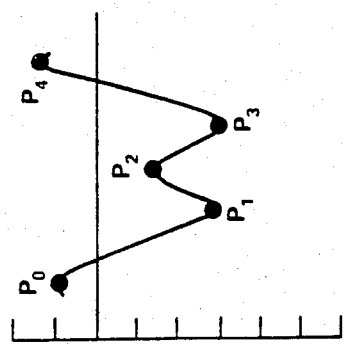
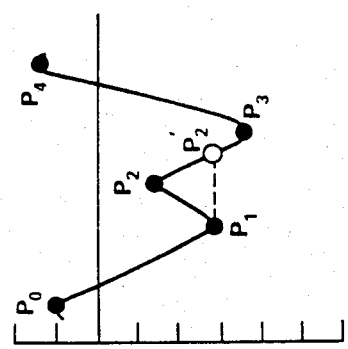
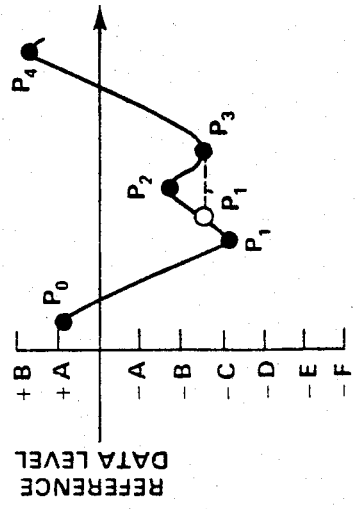
NOTE: *DENOTES THE MAGNITUDE OF THE DATA INTERVAL WITHIN WHICH DATA PEAK OCCURS.

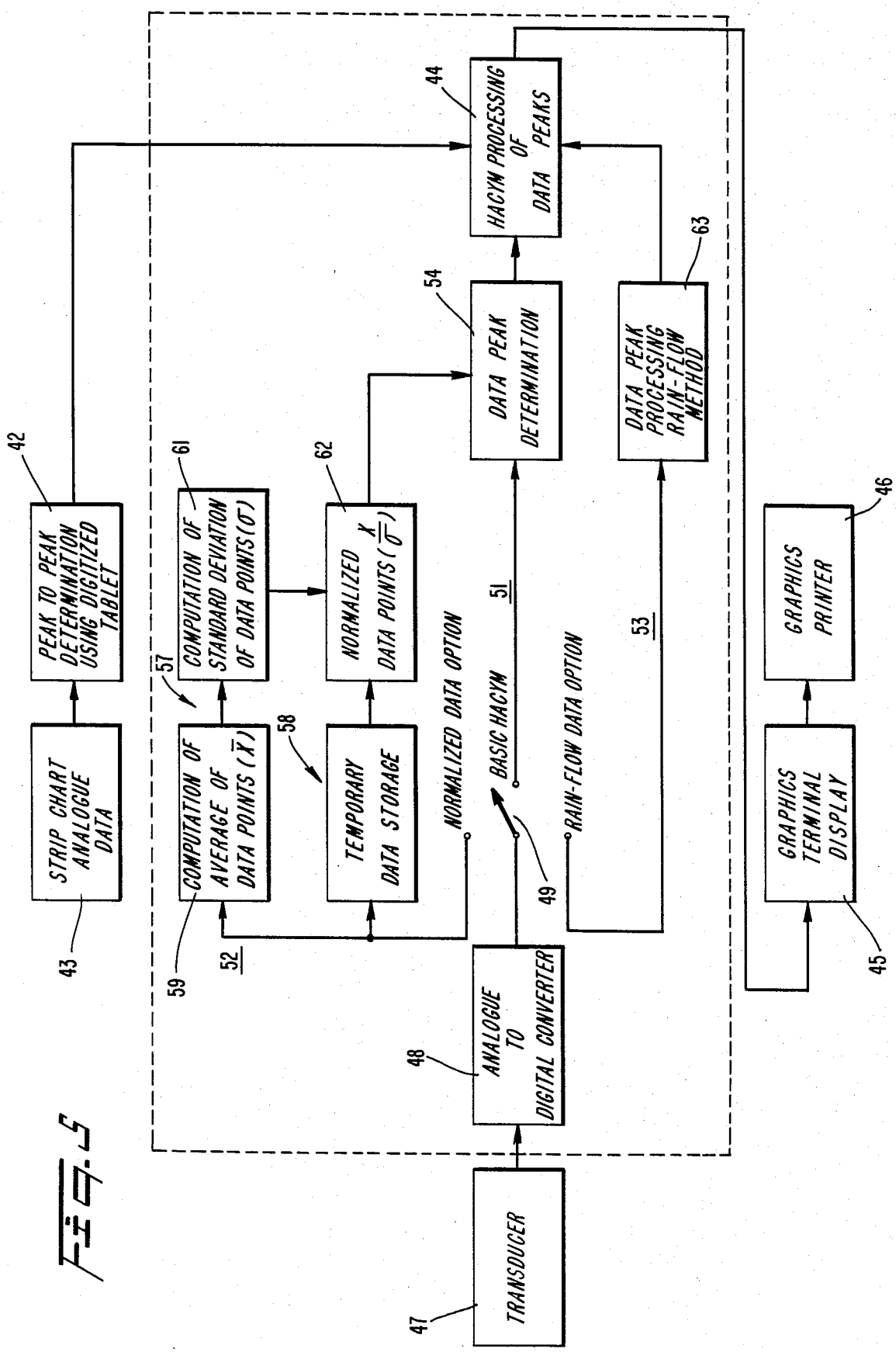

METHOD OF AND APPARATUS FOR INDICATING CHARACTERISTICS OF UNDULATING DATA

TECHNICAL FIELD

The present invention relates generally to a method of and apparatus for indicating characteristics of undulating data and more particularly to such a method and apparatus wherein a display having mutually orthogonal coordinate directions indicates the number of variations having like initial and final peak values at coordinate positions of the display.

BACKGROUND ART

A common method of and apparatus for indicating characteristics of data which undulate with time is to obtain a power or energy density versus frequency response of the undulating data. It is an inherent characteristic of the power or energy density versus frequency technique to time average the energy contributions of the frequency components of a Fourier representation of the undulations in the data. It is also inherent that the power or energy density versus frequency technique neglects the relative phasing of the frequency components and thus indicates only the power or energy of the components. As a result, in certain situations undulations having different characteristics appear to have similar energy or power density versus frequency distribution. In addition, the time averaging effect has a tendency to obscure infrequently occurring events of an extreme and unusual nature so they are not well reflected in the power or energy density versus frequency analysis. Thus, in the power or energy density versus frequency analysis, the more extreme events of undulating data are regarded as statistical events in an ergodic, stochastic process in which the phasing of the frequency components is random and in which events not conforming to the normal process do not exist.

Alternatively, the undulating data peaks are regarded as those of a random variable, whereby the more extreme events conform to a certain mathematical distribution function. Because it is common for many physical processes to exhibit non-linear behavior while undergoing extreme events, a distribution function is chosen in some cases which is intended to represent the process primarily with regard to extreme values thereof. In either case, data undulations of the real process are replaced by a two-dimensional mathematical distribution function which permits a quantitative estimate of the occurrence probability of the more extreme events associated with the process. The two-dimensional nature of the distribution function permits adequate detection of extreme events primarily for narrowband, i.e. narrow frequency range processes, because it characterizes only one quality of the process as a function of the occurrence level. The prior art techniques have, therefore, either not been applicable, or have significant limitations, for identifying unusual or "episodic" events in random, undulating data, i.e., events which tend to stand out from all other events occurring during a particular analysis interval.

Another prior art technique that has been utilized to analyze undulating data, particularly in connection with fatigue lifetime estimatation, is referred to as a peak-valley or half cycle peak to peak analysis. In this prior art analysis technique, oppositely directed peak values of undulating data variations are detected. If the undulating data variation is considered as a half cycle of a wave, the oppositely directed peak values are the positive and negative maximum variations of the half cycle from a median value.

The data derived by the peak-valley technique are typically displayed as a series of numbers printed out by a digital computer. In particular, the computer printout has a format typically arranged in three columns with the titles "Range", "Peak Count" and "Valley Count". Numbers in the range column indicate the number of units between the peak and valley of each half cycle; numbers in the peak column indicate the number of half cycles having peak values in a particular range, while numbers in the valley column indicate the number of half cycles having minimum values in each of the ranges. The peak and valley data are also presented in the prior art as a sequence of maximum and minimum values supplied by a computer to a printer, such that the first maximum and minimum occur in the first and second columns of the first row of a data matrix, the maximum and minimum values of the second half cycle are presented in the third and fourth columns of the first row, etc. In this prior art technique, a dead band is provided, whereby maximum and minimum variations that occur within the dead band are not indicated. While the prior art peak-valley procedure is useful, the data are not presented in a particularly easy to handle manner, nor are certain characteristics of the undulating data immediately obvious from the data presentation.

It is, accordingly, an object of the present invention to provide a new and improved apparatus for and method of indicating characteristics of undulating data.

Another object of the invention is to provide a new and improved method of and apparatus for indicating characteristics of undulating data by employing oppositely directed peak values of variations in the data.

A further object of the invention is to provide a new and improved apparatus for and method of enabling episodic events and other non-linear characteristics of undulating data to be easily detected.

A further object of the invention is to provide a new and improved method of and apparatus for analyzing real time and stored data, to enable episodic events and other non-linear characteristics of undulating data to be easily detected.

DISCLOSURE OF THE INVENTION

In accordance with the present invention, a method of and apparatus for indicating characteristics of undulating data having variations with oppositely directed peak values includes a display having first and second mutually orthogonal coordinate directions, i.e., x and y axes. The oppositely directed consecutive peak values of each variation are detected. Each variation is assigned a coordinate position on the display, such that the coordinate position in the first and second directions is determined by the initial and peak values of each variation. Variations having like initial and final peak values are accumulated so an indication of the accumulated variations is displayed on the coordinate positions of the display.

The method and apparatus are particularly useful for detecting episodic events in random data. An episodic event appears on the display as a single variation at a coordinate position displaced from the coordinate positions of the remaining variations. The remaining variations have been found to follow well defined patterns in the display, thus facilitating the identification of episodic events. The method and apparatus have been used for detecting episodic waves in a hurricane. In addition, the invention can be utilized for determining fatigue loadings on instrumented parts in service. In particular, a strain gauge on a part being tested causes signals to be supplied to an analyzer in accordance with the invention. The analyzer responds to a signal derived from the strain gauge to determine the undulations in force or torque that the part experiences in service. A designer utilizes this information to design the part so that it is able to withstand the undulating loadings as well as any episodic event which represents an extreme loading.

In the preferred embodiment, the display has discrete values in the x and y directions associated with different initial and final values, whereby a series of bins is formed in the x and y directions. The coordinate positions in the x and y directions are determined by assigning each variation to an individual bin. The variations are accumulated by summing the number of variations assigned to each bin. The operations are formed in a computer which supplies numbers to each of the bins. Alternatively, an oscilloscope with storage capabilities could be employed, whereby an area on the oscilloscope increases in light intensity as the variations assigned to the individual bins are summed.

A property of the display is that it includes null and reference level diagonals at 45° to each of the coordinate directions and at right angles to each other. The reference level diagonal is commensurate with a reference level for the variation. The null diagonal is associated with variations which do not cross previously designated data levels. Thereby, each variation is displaced from the null diagonal by an amount associated with the amplitude of the variation and is displaced from the reference level diagonal by an amount associated with the mean value of the variation. By summing the accumulated variations at positions displaced a like amount from the null diagonal for each position displaced from the null diagonal, an amplitude histogram of the undulating data is derived. By summing the accumulated variations at positions displaced a like amount from the reference level diagonal for each position displaced from the reference level diagonal, a mean value histogram is derived. By separately summing the accumulated variations at like coordinate positions in one coordinate direction on each side of the null diagonal, a peak count histogram is derived. These various histograms are useful in analyzing the characterisics of the undulating data.

In accordance with one embodiment, the reference level is arbitrarily selected, as are the magnitude levels of bins in the display based upon the anticipated maximum and minimum values of the undulating data. When the data undulations become characteristically larger or smaller with time, it is desirable to normalize the reference level and the bin level magnitude. To this end, a statistical function of the undulating data for a prescribed time interval, such as standard deviation, is derived. From the derived statistical function, the mean value is automatically derived and is commensurate with the reference level diagonal. In addition, the total statistical function enables the bin amplitude to be established as a percentage of the function, whereby each variation is assigned to a particular coordinate position as a percentage of the total statistical function. Data processed in the normalized format provide a more accurate assessment of the process limiting characteristics because comparisons of a number of variations can be made in the case of a signal level having a root mean square value that changes with time. Also, a more positive identification of episodic data events is provided with the normalized format.

Construction of a three dimensional figure having a unit volume from the normalized data, such that the ordinate, i.e., z axis amplitude, at each bin is indicative of the accumulated variations in the bin provides an interesting result. In such a situation, the z axis amplitude at each coordinate position corresponds to the joint probability of a particular mean value occurring in combination with a particular amplitude for the various undulations in the data.

In one embodiment, the oppositely directed peak values are opposite peaks of each half cycle of the data variations. In a second embodiment, the undulating data are considered as having main variations with maximum oppositely directed peak values on opposite sides of a reference value. The data include subordinate variations between the consecutive maximum peak values. One of the subordinate variations includes a false peak with a value at an intermediate peak value and one intermediate peak value, between the maximum peak values and adjacent one of them. Other subordinate variations subsist between the intermediate peak values between the maximum peak values. The latter type of analysis is referred to in the art as "rain-flow" data processing. In rain-flow processing, the main and subordinate variations are assigned to appropriate locations on the display in response to the initial and final values thereof. Responding to oppositely directed peak values in each half cycle of the wave is particularly advantageous in analyzing sea wave and wind data, while rain-flow processing is particularly useful in connection with fatigue analysis.

Another property of the display is that it enables quick and facile determinations of frequency band characteristics of the undulating data. In particular, if the undulating data has a narrow frequency band, the variations appear on the display as a group event having a longitudinal axis in the direction of the reference diagonal, and a relatively narrow spread in the direction of the null diagonal. In contrast, broad band undulating data, in the form of white noise, results in variations that are formed on the display in a more circular pattern.

The above and still further objects, features and advantages of the present invention will become apparent upon consideration of the following detailed description of several specific embodiments thereof, especially when taken in conjunction with the accompanying drawing.

BRIEF DESCRIPTION OF THE DRAWING

FIG. 3 is an illustration of a display derived from actual sea wave data;

FIGS. 4a–4c are diagrams used to describe a rain-Flow data gathering process;

FIG. 5 is a block diagram of an apparatus for performing the method of the invention;

BEST MODE FOR CARRYING OUT THE INVENTION

Figure 1:
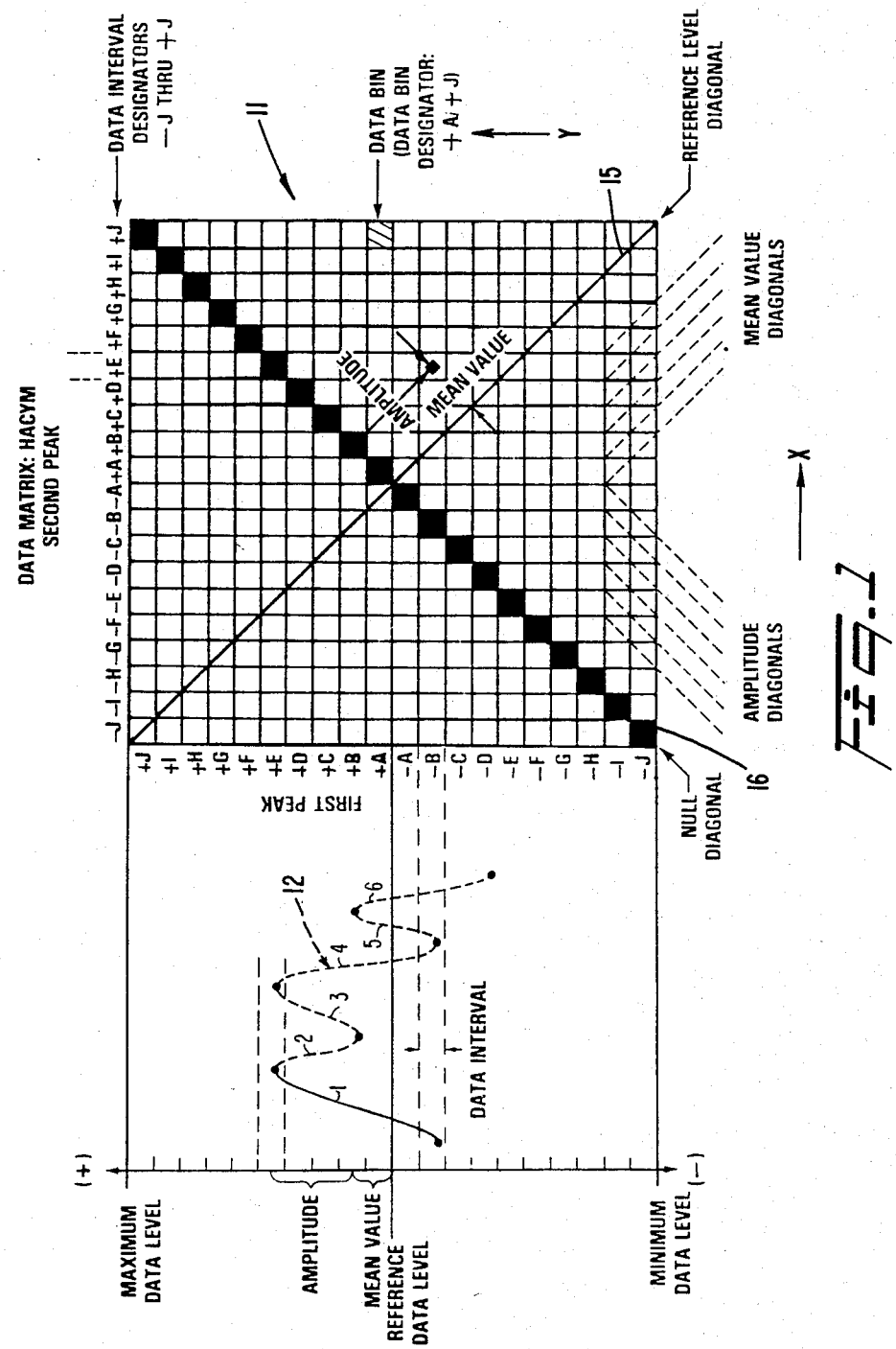
FIGS. 1 and 2 are diagrams of a display in accordance with the invention, in combination with a wave, to assist in describing the method of assigning bins in the display, to assist in describing nomenclature employed in the display, and to indicate how variations in different bins of the display are combined to derive amplitude, mean value, as well as peak count histograms.

Reference is now made to FIG. 1 of the drawing wherein there is illustrated a display 11 having mutually orthogonal coordinate directions, i.e., x and y axes. The x axis is divided into 20 equal amplitude bands, with the highest amplitude band being designated on the right side of display 11 as +J and the lowest amplitude band being designated on the left side of the display as −J. In the center of the x axis is a vertical line separating the lowest positive and negative magnitude bands +A and −A. Each of the amplitude bands +A through +J and −A through −J represents an equal amplitude interval for the final, i.e., peak, value of an undulating data variation; in the case of the half cycle variations indicated by waveform 12, the data intervals in the x direction represent the positive maximum values of the waveform. Similarly, in the y axis direction, there are 20 equal amplitude bands for the initial peak values of each undulating data variation, designated by −J through −A and +A through +J. A horizontal line between data bands +A and −A represents a reference data level. Thus, in the case of half cycles of waveform 12, the initial peak value of each half cycle is assigned to one of the data levels −J through +J. The maximum and minimum values of the undulating data variations are associated with the maximum and minimum values of data bands +J and −J in the x and y axis coordinate directions.

Exemplary waveform 12 is indicated as being divided into 6 half cycle variations designated as 1-6, on the waveform. The variation of half cycle 1 has a minimum, peak value in band −B and a maximum, peak value in band +E. Thereby, the variation of half cycle 1 is assigned a position in band −B, in the y axis direction, and band +E in the x axis direction. The variation associated with half cycle 2 has an initial, maximum amplitude in data band +E and a final, minimum value in amplitude band +B. Thereby, the variation of half cycle 2 is assigned to a bin having an x axis position of +B and a y axis position of +E. The variation of half cycle 3 has an initial, minimum value associated with amplitude band +B and a final, maximum peak value associated with amplitude band +E, causing the variation of half cycle 3 to be assigned to a coordinate position x=+E, y=+B. The variation of half cycle 4 has initial, maximum and final, minimum peak values of +E and −B, respectively, whereby the variation of half cycle 4 is assigned on display 11 to a bin having a coordinate position x=−B, y=+E. The variation of half cycle 5 has initial, minimum peak and final, maximum peak values of −B and +B, respectively, causing the variation of half cycle 5 to be assigned to coordinate position x=+B, y=−B. The variation of half cycle 6 has initial, maximum peak and final, minimum peak values of +B and −D, respectively, causing the variation of half cycle 6 to be assigned to the coordinate position x=−D, y=+B.

As the data undulation continues, half cycles having like variations are accumulated at the bin positions associated with like half cycle variations. Thus, a half cycle having the same initial and final peak values as half cycle 1 causes a count associated with bin position x=+E, y=−B to be incremented by a count of 1. Thus, for the data undulations indicated by waveform 13, FIG. 2 display 14 is established. From display 14, it is possible to determine that there are nine half cycle variations in wave 13 having initial and final values respectively associated with band levels −B and +C, and that there are 6 half cycles in wave 13 having initial and final values respectively associated with band levels +B and −C.

A property of displays 11 and 14 is that each includes a reference level diagonal 15 and a null diagonal 16. Diagonals 15 and 16 are at right angles to each other and at 45° to the x and y coordinate axes. Reference level diagonal 15 is associated with a reference data level of the analyzed waveform. For the situation illustrated in FIGS. 1 and 2, for waveforms 12 and 13, the reference data level is arbitrarily selected, as are the maximum and minimum data levels +J and −J. Null diagonal 16 cannot be occupied by any variations of the undulating data because each bin along the null diagonal is associated with data variations which fail to cross any one data level. Each bin is displaced from reference level diagonal 15 by an amount indicative of the mean value of the variation. The displacement of each bin from null diagonal 16 is indicative of the amplitude of the half cycle variation.

Consider the case of half cycle 1, FIG. 1, having initial and final amplitudes in bands −B and +E and an assignment on display 11 at x=+E, y=−B. The coordinate position x=+E, y=−B is one and a half units from mean value diagonal 15 and three units from null diagonal 16. This signifies that the variation of half cycle 1 has a mean value one and a half units above the data reference level and an amplitude of three units from the mean value thereof to the positive and negative peak values thereof. An inspection of the variation of half cycle 1 of waveform 12 reveals that the mean value of half cycle is one and a half units above the reference data level and that amplitude of half cycle variation 1 is three units in either direction relative to the mean value of the half cycle variation.

In response to wave record 13 being analyzed to derive the data presented by display 14, the value accumulated in each bin of the display indicates the number of half cycle variations having a particular mean value relative to reference level diagonal 15 and a particular amplitude relative to the mean value. Thus, for the situation illustrated in connection with display 14, FIG. 2, the accumulated value of nine at coordinate position x=+C, y=−B, indicates that there are nine half cycle variations in wave record having a mean value displaced by one unit from the value associated with reference level diagonal 15 and that these nine half cycle variations have an amplitude of two units relative to the mean value.

Figure 2:
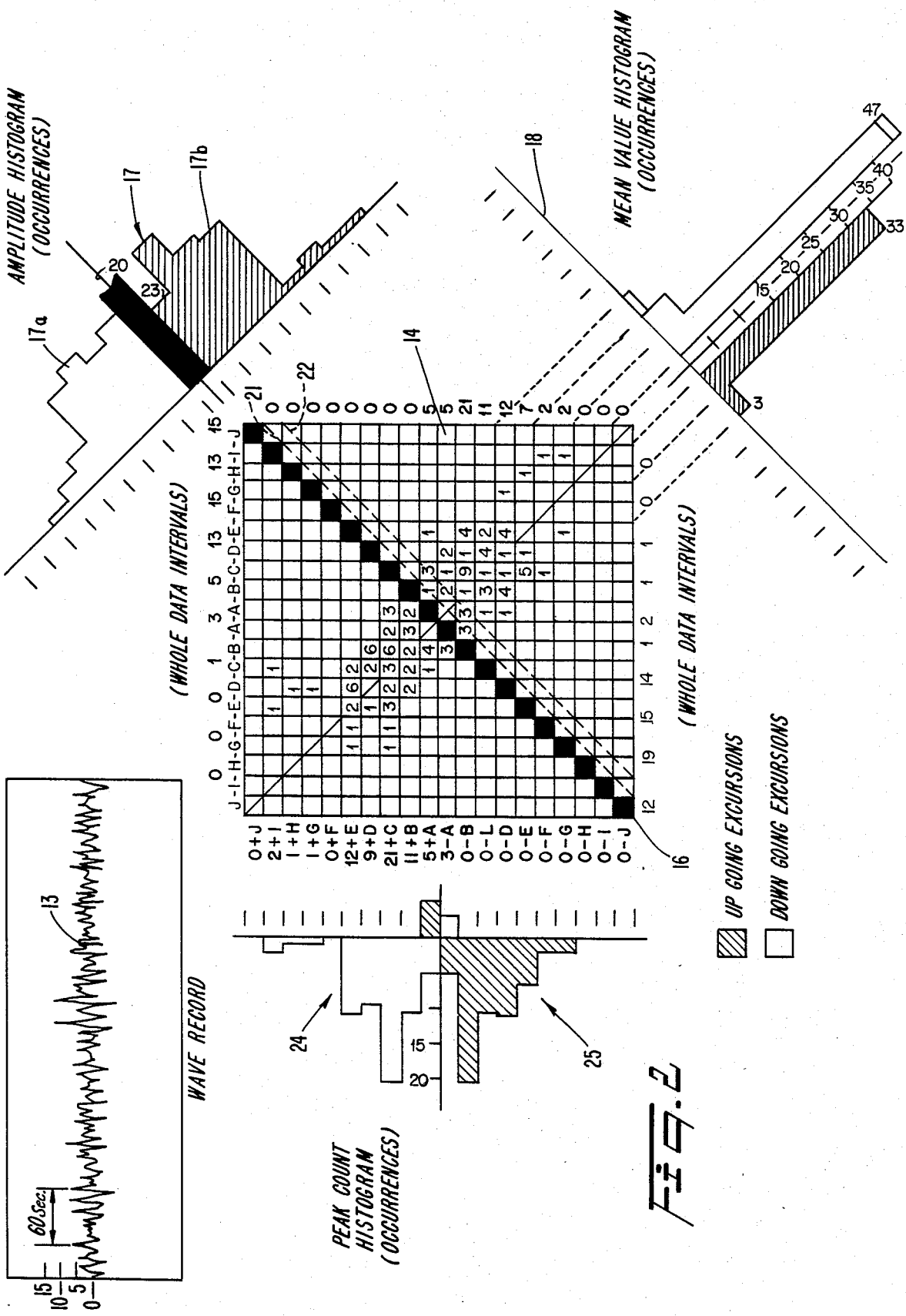

From the foregoing, diagonals displaced by a like amount from reference level diagonal 15 represent mean values having like value; these diagonals are referred to as mean value diagonals. Similarly, diagonals displaced by a like amount from null diagonal 16 are referred to as amplitude diagonals. By summing together the accumulated values in the mean value diagonals and the amplitude diagonals, mean value and amplitude histograms 17 and 18 are formed and displayed. Amplitude and mean value histograms 17 and 18 are formed by summing the accumulated variations in amplitude and mean value diagonals k and (k+1) where k is an odd numbered diagonal of the display relative to the null and reference diagonals. The basis for accumulation is shown in FIG. 2 by the bold lines in the array of bins.

Thus, for the first and second diagonals 21 and 22 to the right of null diagonal 16, the accumulated values in the bin positions along the diagonals are summed together to form level 23 in histogram 17. In particular, for diagonal 21 the accumulated variations of 1 and 3 in bin positions x=+B, y=+A and x=−A, y=−B are summed together with the accumulated variations of 3, 2, 3 in diagonal 22, at positions x=+C, y=+A; x=+B, y=−A; x=+A, y=−B, to form a sum equal to 12. Similarly, the remaining diagonal pairs at like distances from null diagonal 16 are summed together to form amplitude histogram 17. Mean value histogram 18 is somewhat similarly formed by combining the variations in diagonals at like distances from null diagonal 16. However, there is a sum along the reference level diagonal such that values in all bins on the diagonal are added to the values in the bins adjacent the reference level diagonal bins on the right side of both diagonals and to the values in the bins adjacent the reference level diagonal on the left side of both diagonals. Each discrete level of the mean value histogram to the left of the reference level diagonal is the sum of the values in a pir of bins horizontally displaced by k and (k+1) bins from the reference level diagonal on the right side of the null diagonal and the sum of the values in a pair of bins, horizontally displaced by (k+1) and (k+2) from the reference level diagonal on the left side of the null diagonal, where k is an odd numbered integer. Each discrete level of the mean value histogram to the right of the reference level diagonal is the sum of the values in a pair of bins horizontally displaced by (k+1) and (k+2) bins from the reference level diagonal on the right side of the null diagonal and the sum of the value in a pair of bins horizontally displaced by k and (k+1) from the mean level diagonal on the left side of the null diagonal.

Amplitude histogram 17 is thus an x-y plot of the number of variations having a particular amplitude, where the number of variations is plotted along the histogram y axis, and the amplitude of the variations is plotted along the histogram x axis. The portions of histogram 17 to the right and left of null axis 16 are respectively indicative of positive and negative going variations of waveform 13. Mean value histogram 18 is an x-y plot having a y value indicative of the number of half cycle variations versus an x value indicative of the mean value of the variation. The portions of histogram 18 to the right and left of null diagonal 15 respectively indicate the number of half cycle variations having mean values above and below the reference level associated with the reference level of waveform 13.

By separately summing the accumulated variations to the right and left of null diagonal 16 at like y positions of display 14, peak count histograms for the positive and negative going variations are formed. For example, in display 14, along y coordinate position +C the sum of the accumulated values is 21. Because all 21 accumulated variations at y=+C are to the left of null diagonal 16, the 21 variations are associated with negative going half cycles of waveform 13. Similarly, at coordinate position y=−A, there are three variations in bin x=−B, y=−A to the left of null diagonal 16. These three variations are indicated as negative going half cycles. To the right of null diagonal 16, at position y=−A, there is a sum of five, with accumulated variations of 2, 1 and 2 at positions x=+B, x=+C, and x=+D, respectively. The sum of five accumulated variations to the right of null diagonal 16 are indicated as positive going variations.

The sums formed in response to the accumulated variations to the left and right of null diagonal 16 result in the construction and display of histograms 24 and 25 to the left of the display. Histograms 24 and 25 respectively represent the negative and positive going half cycle variations of waveform 13, with the x axis of the histograms representing the initial value of each half cycle variation, and the y axis of the histogram representing the number of half cycle variations having the particular initial half cycle value. A similar histogram can be constructed by summing together variations in like x axis coordinate positions to the left and right of null diagonal 16, to provide histograms for the positive going variations relative to the final value of each half cycle variation.

Display 14 thus represents a matrix having 20 data bins in each of the x and y coordinate directions, i.e., a total of 400 data bins. The use of 400 data bins is recommended, based upon present experience with the data analyzed. The use of 400 data bins has been found to provide a reasonably good definition of half cycle count dispersion, considering that a large number of data bins result in too few bin counts for good dispersion definition; on the other hand, too few data bins prevent good dispersion definition. The use of a 20×20 matrix also causes the data intervals or bands in the x and y coordinate directions to be 0.1 of the maximum and minimum data levels of the undulating data being analyzed. This is particularly useful in dealing with a non-dimensioned, normalized display.

A normalized display is derived by determining the standard deviation ($\sigma$) of the undulating data being analyzed. After the standard deviation has been determined, the maximum and minimum data values in the x and y coordinate directions are established as $+6\sigma$ and $-6\sigma$, for example. Each of the detected peak values for the waveform is divided by the standard deviation. The thus divided peak values are entered into the matrix as a percentage of standard deviation and thus provide an indication of the contribution to the total standard deviation. By constructing the matrix in this manner, reference level diagonal 15 is automatically associated with the mean value for the analyzed data undulations. Thereby, the display has a greater tendency to be symmetrical with respect to reference level diagonal 15 and null diagonal 16. It is also found that a random process in which the magnitude of the undulating data characteristically change with time can be rendered stationary in time upon being normalized with respect to the value of $\sigma$ existing during each interval of data analysis. This greatly facilitates characterizing the process with respect to its extreme values over a long period of time. It has been found in the analysis of broad-band data undulations that the distribution of amplitude peak counts, as indicated by histograms 17a and 17b, tends toward a normal distribution. Since the degree of normality is of interest in some applications, the amplitude histograms 17a and 17b, can be constructed in response to the sum of the accumulated variations in the individual amplitude diagonals without combining adjacent bin counts. This permits a more precise definition of the distribution of amplitude peak counts.

To eliminate the effect of hash and relatively small amplitude variations on the peak value determinations, each of the amplitude bands $+J$ through $-J$ is provided with a dead band, typically 10 percent on both sides of each bin. Thereby, very small excursions of the undulating data are not indicated as full half cycle variations.

Figure 3:
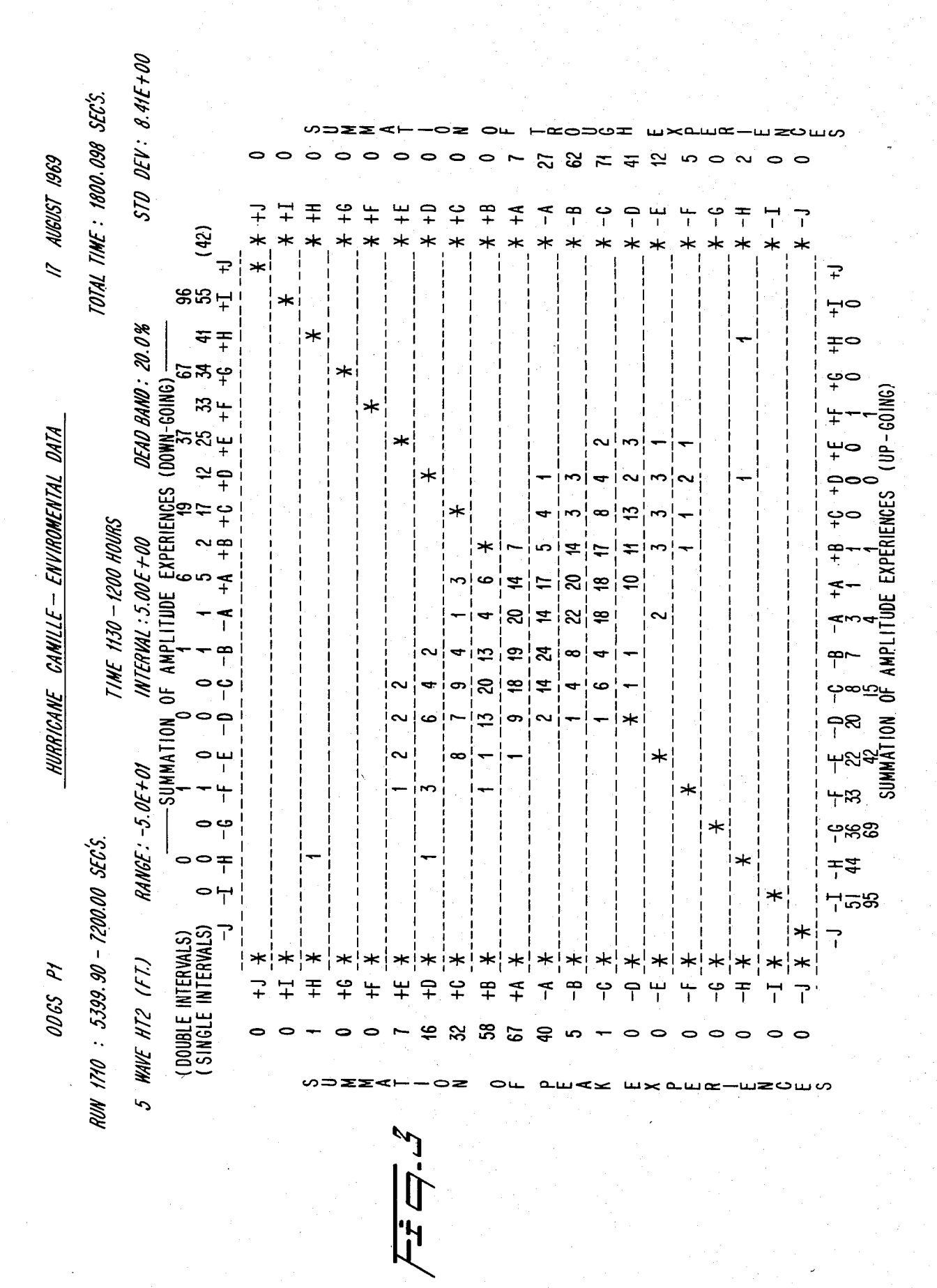

FIG. 3 is a printout of an actual display of sea wave data collected during one half hour of hurricane Camille. During the one-half hour there are approximately 180 half cycle data variations that are normalized so that there is substantial symmetry with regard to the null and reference value diagonals. The substantial symmetry of the recorded data variations on opposite sides of the diagonal is noted. The display is of particular interest for indicating the presence of an episodic event indicated by entries of one at $x=-H$, $y=+H$ and $x=+H$, $y=-H$, which are far removed from the remaining data entries in the display. Analysis of the sea wave data indicates that the wave designated by the entries at $x=-H$, $y=+H$ and $x=+H$, $y=-H$ was, in actuality, the largest wave in the hurricane. This wave occurred considerably before the full fury of the hurricane occurred. The largest wave in the storm was preceded and followed by further large wave excursions, indicated in the display of FIG. 3 by entries at $x=-H$, $y=+D$ and $x=+D$, $y=-H$. The wave excursions at $x=-H$, $y=+D$ and $x=+D$, $y=-H$ are also considered as episodic events because they are separated from all of the other data entries in the display of FIG. 3. All of these episodic excursions are consecutive excursions associated with the largest wave, at $x=-H$, $y=+H$, $x=+H$, $y=-H$.

While wave height analysis can be performed quite satisfactorily with half cycles of the recorded information, other data are not accurately represented in this manner. In particular, for certain data concerned with fatigue measurements, for example, a rain-flow processing technique is advisable. The rain-flow processing technique overcomes a disadvantage associated with the half cycle technique as applied to estimation of cumulative fatigue damage because intermediate data points between zero-crossing wave peaks which cause major fatigue damage have a tendency to become lost in the half cycle variation technique, i.e., the zero-crossing wave peaks are recorded as elemental variations. In the rain-flow method, major data peaks associated with zero crossing are counted separately from cycles associated with intermediate data peaks. If the undulating data contain successive peaks entirely within a data interval, the peaks are disregarded as far as counting of half cycle variations is concerned.

The rain-flow procedure is important in cases where broad-band data are being processed, such as in connection with deriving fatigue loads. The rain-flow process arises from an analogy of standing undulating data on end and following a path rainwater would take in passing over successively increasing data peaks.

The method for determining successive peaks in accordance with the rain-flow method is indicated for three cases in FIGS. 4a-4c. In each of FIGS. 4a-4c two waveforms which are mirror images of each other with respect to a reference data level are illustrated. The technique for determining rain-flow peak values is the same, regardless of polarity. Therefore, in considering FIGS. 4a, 4b and 4c, the peak values are considered in connection with the waveforms above the reference data level.

In case 1, waveform 31 includes negatively directed peak values or troughs $P_0$, $P_2$, and $P_4$ wherein trough $P_2$ has a value above the reference data level. Waveform 31 includes positively directed peak values $P_1$ and $P_3$, both of which have an amplitude greater than $P_2$, wherein $P_1$ is between $P_0$ and $P_2$; point $P_3$ is between points $P_2$ and $P_4$, and is at a lower amplitude than point $P_1$. Point $P_1'$ is designated in the portion of waveform 31 between points $P_1$ and $P_2$ having the same amplitude as point $P_3$. The half cycle variation from point $P_1$ to $P_2$ is thus subdivided into two half cycles by the "false peak" at point $P_1'$. The portion of waveform 31 between points $P_1$ and $P_4$ can be considered as a main variation between maximum peak values at points $P_1$ and $P_4$. In the main variation between points $P_1$ and $P_4$ there are intermediate variations from the false peak at $P_1'$ to point $P_2$ and from subordinate peak point $P_2$ to subordinate peak $P_3$. Thus for waveform 31 a half cycle count is entered into the data matrix of FIG. 1, to form a half cycle $P_1$ to $P_4$ which is entered into the matrix of the display as a single half cycle variation having an initial value of $+D$ and a final value of $-B$. The half cycles $P_1'$ to $P_2$ and $P_2$ to $P_3$ are also entered into the matrix to complete the rain-flow procedure. In contrast, in the conventional half cycle procedure, the data undulation from $P_1$ to $P_4$ is entered into the matrix of the display as first, second and third half cycles respectively having initial values of $+D$, $+B$ and $+C$, and final values of $+B$, $+C$ and $-B$.

In the situation illustrated in FIG. 4b, waveform 32 is illustrated as including four half cycles. The first half cycle extends between points $P_0$ and $P_1$, respectively having initial and final amplitudes in amplitude ranges $-B$ and $+D$; the second half cycle has initial and final values in amplitude ranges $+D$ and $+B$; the third half cycle has initial and final values in amplitude ranges $+B$ and $+E$; and the fourth half cycle has initial and final values in amplitude ranges $+E$ and $-B$. A "false peak" is located at point $P_2'$, between points $P_2$ and $P_3$, at the amplitude of point $P_1$ because point $P_2$ is a minimum peak having an amplitude above the reference data level. The half cycle from point $P_2$ to point $P_3$ is subdivided and half cycle counts corresponding to variations from point $P_1$ to point $P_2$, from point $P_2$ to point $P_2'$ and from point $P_0$ to point $P_3$ are formed. The portion of waveform 32 between points $P_0$ and $P_3$ is entered into the matrix of the display, as a single variation having initial and final values in bands $-B$ and $+E$. The half cycles $P_1$ to $P_2$ and $P_2$ to $P_2'$ are also entered into the matrix to complete the rain-flow procedure.

In less idealized data undulations, a number of half cycle variations may occur in succession which do not cross the reference data level. In these situations, the rain-flow procedures of FIGS. 3a and 3b apply successively so an intial peak, such as at point $P_1$, is finally joined to a peak somewhere beyond point $P_4$, depending upon the number of successive half cycles which occur without the reference data level being crossed.

In the situation illustrated in FIG. 4c, points $P_1$ and $P_3$ both fall within the range of reference data level $+C$. Between points $P_1$ and $P_3$ is point $P_2$, within reference data level $+B$. The half cycle ending at point $P_1$ begins at point $P_0$, in reference data level $-B$, while the half cycle beginning at point $P_3$ terminates at point $P_4$, also in data level range $-B$. In the situation in FIG. 3b, no false peaks exist and standard half cycle counting procedures are employed.

The apparatus for performing the described methods is illustrated in FIG. 5 for several different structures that supply information to a conventional data processor 41. In one preferred embodiment, data processor 41 is a Computer Data Corporation (CDC) 6600 digital computer programmed in Fortran IV language. Data processor 41 is provided with certain conventional programs, as well as programs developed specifically for the present invention. Flow diagrams of the programs developed specifically for the invention are presented in in FIGS. 6 and 7; program listings for these programs are being concurrently deposited with the United States Patent and Trademark Office.

In one configuration, data processor 41 is responsive to binary signals derived from digitizing tablet 42, such as presently available from Tektronix, Inc., Beaverton, Oreg. Data are entered into digitizing tablet 42 by an operator inspecting strip chart 43, containing analog data undulations previously derived from a suitable transducer. The operator places a cursor on each peak value and presses a button. In response to the button being pressed, digitizing table 42 derives a digital signal that is supplied to data processor 41 and has a value commensurate with the value on the trace where the cursor is located. Data processor 41 includes a program 44, described infra in connection with FIG. 7, which assembles the peak values associated with the half cycle variations into the data format described in connection with FIG. 1. Data processor 41 derives a sequence of signals that is supplied to graphics terminal display 45, which drives graphics printer 46 to provide a display as illustrated in any of FIGS. 1, 2 or 3. Alternatively, the display can be presented on the face of a cathode ray tube having x and y coordinate directions and provided with conventional, state-of-the-art circuitry for writing the matrix and accumulated numbers on the face of the screen.

Data processor 41 can also be directly responsive to an analog signal derived from transducer 47. Transducer 47 can be either a real time transducer, such as a strain gauge, sea wave gauge or wind gauge, or a magnetic tape head responsive to stored analog data derived from such gauges. Transducer 47 supplies an analog signal to analog to digital converter 48 which selectively supplies binary signals commensurate with sampled date points in the signal derived from transducer 41 to one of channels 51, 52 or 53 within data processor 41. To this end, the binary output signal of converter 48 is illustrated as connected via switch 49 to an input terminal of one of channels 51, 52 or 53.

Figure 6:
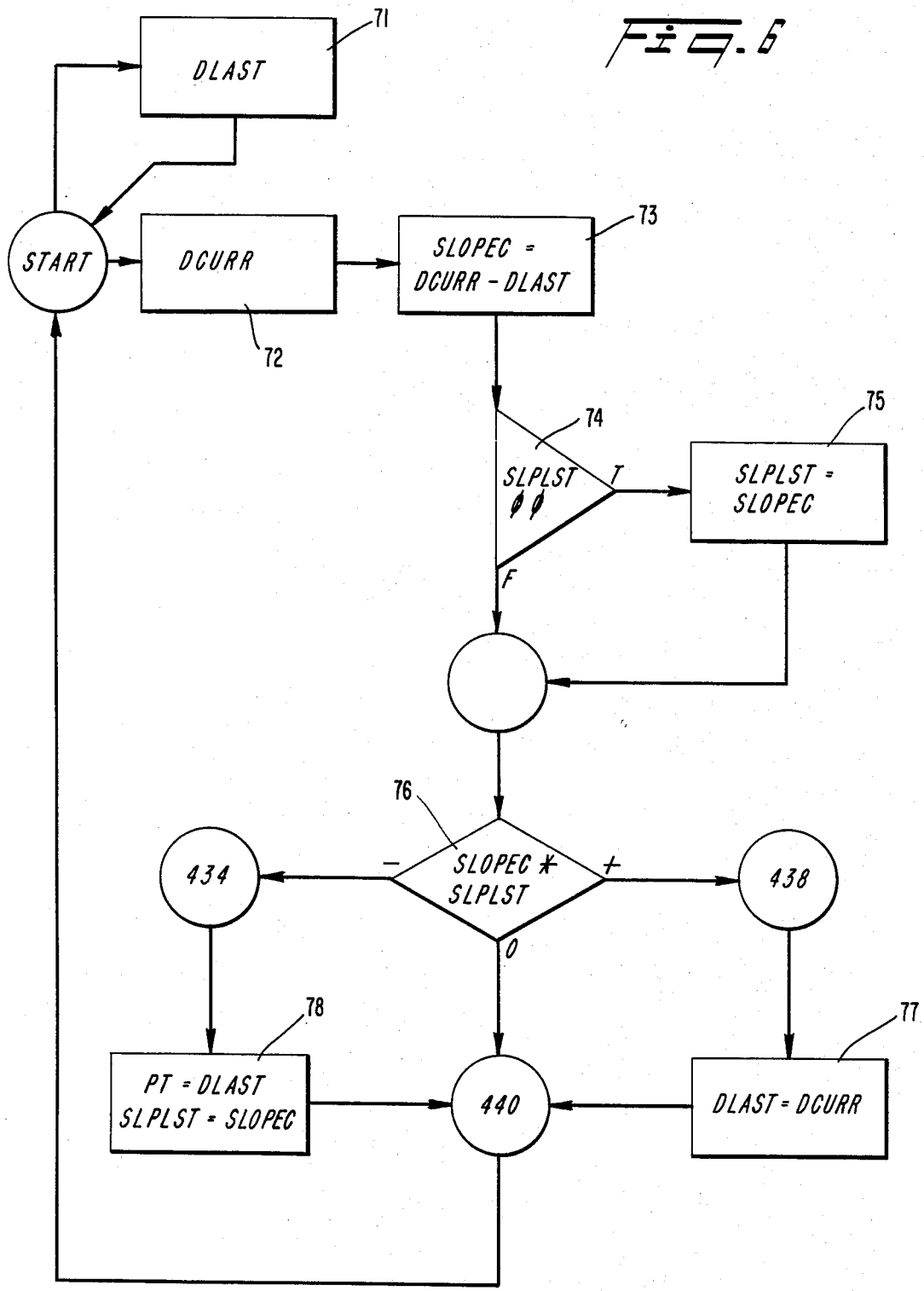
FIG. 6 is a flow diagram of the data peak determination program performed by a computer in the apparatus of FIG. 5.

With switch 49 connecting the output of analog to digital converter 48 to channel 51, data processor 41 executes peak data determination program 54. Program 54, the flow diagram of which is illustrated in FIG. 6, includes provisions for detecting changes in the slope direction of the signal supplied to it by way of channel 51. Peak data determining program 54 also determines the level of bands or ranges into which the determined peak values fall, with an appropriate dead band being provided, as indicated supra.

The data peaks determined by program 54 are supplied internally of data processor 41 to program 44. Program 54 supplies program 44 with peak indicating signals only while channels 51 and 52 are coupled to converter 48 by way of switch 49. Data peak determining program 54 is responsive to binary signals derived by converter 48 at several sampling points during each half cycle of the data undulation. The sampling rate of converter 48 is sufficiently high to enable program 54 to detect each peak in the output of transducer 47 with the required resolution.

With switch 49 activated so that the binary output signal of converter 48 is supplied to channel 52, peak determining program 54 is supplied with a signal that is normalized, as a statistical function; the particular statistical function is proportional to standard deviation of the output of transducer 47 over a predetermined time interval of the signal sensed by the transducer. To form the normalized signal values, channel 52 includes parallel branches 57 and 58. Branch 58 includes a temporary data storage element of data processor 41, whereby all of the binary data representing output signals of converter 48 are loaded into the temporary data storage over a predetermined time interval. In one preferred embodiment, the time interval is one-half hour of actual signal data undulations. Branch 57 includes program 59 for computing a signal representing the average value of the sampled data values derived by converter 48 in accordance with:

$$\frac{1}{N} \sum_{n=1}^{n=N} x_i = \bar{x},$$

where N = the number of sampled data points in the interval, and $X_i$ = the value of a sampled data point in the N samples.

The computed value signal representing x derived by program 59 is supplied to program 61 which computes standard deviation ($\sigma$) of the N data points, i.e., the total standard deviation over the interval of interest. The standard deviation is computed in accordance with the usual formula, namely:

$$\left[ \frac{1}{N} \sum_{n=1}^{n=N} x_i^2 - \bar{x}^2 \right]^{\frac{1}{2}} = \sigma_x.$$

A signal representing the standard deviation determined by program 61 is supplied by program 61 to program 62, which computes the normalized value of the data points $X_i$ as $X_i/\sigma_X$ in response to signals representing the values of data points $X_i$ read out of temporary data storage 58. Thus after signals representing the N data points have been stored in data storage element 58 and the standard deviation for the N data points has been computed by program 61, program 62 computes the value of $X_i/\sigma_X$ for each of the sampled data points. Alternatively, the standard deviation can be computed on a running, real time basis, in which case program 61 continuously supplies standard deviation indicating signals for the last N data points to program 62, which continuously responds to the signals representing data points $X_i$, as derived from temporary data storage 58. In the running, real time situation, temporary data storage 58 merely provides sufficient delay to enable the standard deviation for the previous N data points to be determined by programs 59 and 61. However, in the batch situation wherein data are accumulated for a one-half hour interval for example, signals representing all of the stored data points in storage element 58 are read out from the storage element into program 62 in a rapid sequence, which is followed by an interval necessary to accumulate N additional data points.

The normalized N data point signals derived from program 62, either on a continuous, real time basis or on a batch basis, are supplied to data peak determination program 54. Data peak determination program 54 responds to the normalized data point signals derived from program 62 to determine the peak values at the different level bands in response to slope changes, with a dead band being provided in the level banding process.

With switch 49 activated so that the output signal of analog to digital converter 48 is supplied to channel 53, data peak processing is attained in accordance with program 63, which is similar to the program included in the Datamyte Model 401 Data Processor/Recorder, available from Electro/General Corporation, Minnetonka, Minn., and described supra in connection with FIGS. 4a, 4b and 4c. Program 63 derives a binary signal representing the rain-flow peak values, which signal is applied to program 44.

The operations performed by data peak determination program 54 of processor 41 are illustrated, in flow diagram form, in FIG. 6. In the flow diagram of FIG. 6, the following nomenclature is employed:

SLPLST: Magnitude and direction of slope of immediately preceding half cycle variation
SLOPEC: Magnitude and polarity of slope of currently processed half cycle variation
DCURR: Magnitude and polarity of currently processed data point
DLAST: Magnitude and polarity of immediately preceding processed data point
PT: Date point that has been determined to be a maximum or minimum peak When program 54 is initially entered, a signal representing the value of the immediately preceding data point (DLAST) is read during operation 71 from memory and supplied to a register in the arithmetic unit of the data process. Then, during operation 72, a signal representing the currently determined data point value (DCURR) is read from a memory location in the data processor 41 which is directly responsive to the output of converter 48. After operation 72 has been performed and a signal representing the value of DCURR has been loaded into a register of the arithmetic unit, the arithmetic unit subtracts the signal representing the value of DLAST from the signal representing the value of DCURR, to determine the magnitude and polarity of the slope of the currently considered half cycle variation (which slope is SLOPEC); this subtraction operation is indicated in the flow diagram by operation 73.

After operation 73 has been completed, a test is made to determine if the slope of the immediately preceding half cycle variation (SLPLST) is equal to zero by supplying the signal representing SLPLST to the arithmetic unit where it is compared with a signal representing zero; operation 74. If operation 74 indicates that the slope of the immediately preceding half cycle is equal to zero, the value for that slope is changed so that it is equal to the slope of the currently considered half cycle variation by loading an area in memory designated for SLOPEC with a signal indicative of the value of SLPLST; operation 75.

After operation 75 has been completed or if operation 74 indicates that SLPLST is not equal to zero, the program advances to operation 76, during which the slope of the currently considered half cycle is multiplied by the slope of the immediately preceding half cycle. To this end, signals representing SLOPEC and SLPLST are supplied from the memory to the arithmetic unit where they are multiplied to derive a product representing signal. The product derived during operation 76 can produce three results, namely the derivation of a positive product, a negative product or a zero product. The positive product occurs in response to the immediately preceding and currently considered slopes having the same slope direction, i.e., no peak value has been detected. Similarly, a zero result from operation 76 indicates that no peak value has been detected because the current and/or immediately preceding slopes have a zero value. A negative product from operation 76 indicates that one of the currently considered and immediately preceding slopes were positive and negative, resulting in detection of a peak value. The slope polarity is determined by detecting whether an initial polarity indicating bit in a binary signal representing the product has a zero or one level; a zero value is detected in the arithmetic unit by comparing the magnitude representing bits of the product signal with zero.

In response to operation 76 indicating that there is no change in slope, as indicated by a signal indicating a zero product from operation 76, there is no change in DLAST and the program indicated by FIG. 6 recycles back to the starting point. If, however, operation 76 indicates that there is no change in slope direction, and that there is a change in slope magnitude, the program advances to operation 77. In operation 77, the signal representing the value of the immediately preceding data point value (DLAST) is set equal to the signal representing the value of the data point value considered during the cycle under consideration (DCURR). Upon completion of operation 77, the program returns to a starting position. Thereby, during the next cycle, the signal representing the value of DCURR, found during the currently considered cycle is read from memory during operation 71.

In response to operation 76 indicating that the product has a negative value whereby a peak value has been determined, the program advances to step 78. In step 78, the signal representing the value of DLAST in the memory at the beginning of the currently considered cycle is supplied to the memory as a data point value that has been determined to be a maximum or minimum peak. In addition, during operation 78, the signal representing the slope of the currently considered half cycle is set equal to the signal representing the slope of the immediately preceding half cycle, i.e., SLPLST=SLOPEC. Upon completion of operation 78, the program returns to the start position.

Figure 7:
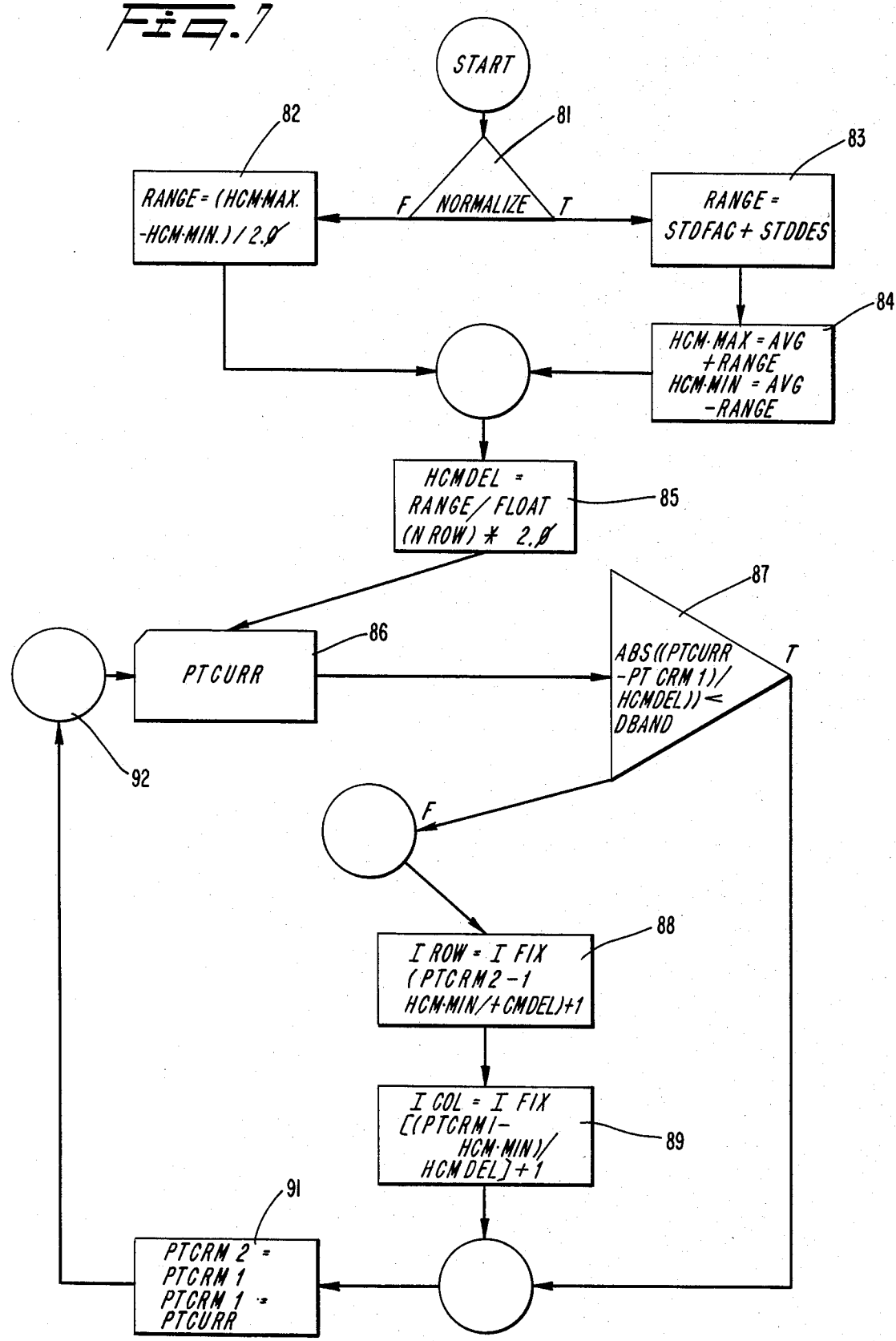
FIG. 7 is a flow diagram of the program performed by a computer for formation of a half cycle matrix (HACYM), with dead banding.

Reference is now made to FIG. 7 of the drawing, a flow diagram of the operations performed in connection with forming the half cycle matrix, with the dead banding provision. In the flow diagram of FIG. 7, the following nomenclature is provided:

PTCURR: Data value of most recently detected maximum or minimum peak value
PTCRM1: Maximum or minimum peak data value determined immediately before PTCURR
PTCRM2: Maximum or minimum peak data value determined immediately before PTCUM1
DBAND: Dead band
STDFAC: Normalizing factor
STDDEV: Standard deviation of data points
AVG: Mean value of data points
HCMMIN: Most negative or minimum value in the display matrix
HCMMAX: Maximum value in matrix display RANGE: One-half of the range of the matrix display between the maximum and minimum values thereof, i.e., ½(HCMMAX−HCMMIN)

IROW: Row location of maximum or minimum peak value in matrix display

ICOL: Column location of maximum or minimum peak value in matrix display

HCMDEL: Bin size in the x and y directions of the matrix

FLOAT: Fractional value of arithmetic operation retained

NROW: Fractional value of arithmetic operation eliminated

IFIX: Truncate arithmetic operation

The initial operation involved in program 44 is determining whether the program is operating in accordance with a normalized or basic configuration, i.e., sense whether converter 48 is supplying signals to channel 51 or 52; operation 81. In response to operation 81 indicating that a normalized situation is not being handled and that channel 51 is operative, the range of the matrix is set; operation 82. In operation 82 the range is determined by supplying signals HCMMIN and HCMMAX from the memory to an arithmetic unit of the data processor, where the operation range is computed to derive a signal representing (HCMMAX−HCMMIN)/2.0. Alternatively, if operation 81 indicates that a normalizing mode is being handled, the program advances from operation 81 to operation 84, where range is calculated by supplying signals representing normalizing factor (STDFAC) and the standard deviation (STDDEV) from the memory to the arithmetic unit, where they are combined to form a range representing signal in accordance with STDFAC×STDDEV. Specifically, the normalization factor STDFAC is preset 6, whereby the range of the matrix is determined as 6 times the standard deviation of the data undulations during the time interval under consideration.

After completion of operation 83, the program advances to operation 84 which the matrix minimum and maximum values are determined from the previously computed average value signal AVG, for the undulating data over the time interval being considered. In particular, during operation 84 a signal representing HCMMAX is computed by combining signals AVG and RANGE to derive a signal representing AFG and RANGE; a signal representing HCMMIN is determined as AVG−RANGE.

After operation 82 or 84, whichever is performed, the bin size in the x and y coordinate directions (HCMDEL) is determined during operation 85. During operation 85 a signal representing the value of RANGE determined during operation 82 or 83 is calculated by dividing the signal representing the value of RANGE by a signal representing the number of rows in the matrix (NROW) multiplied by a signal representing a factor of 2.0. Upon completion of operation 85, the program advances to operation 86, during which the signal representing the most recently determined peak value (PTCURR) as determined during program 54, is read from memory to a register in the arithmetic unit.

Upon completion of operation 86, the program advances to operation 87 during which signals representing the values of PTCRM1, HCMDEL and DBAND are read from the memory to the arithmetic unit which subtracts the signal representing the value of PTCRM1 from the signal representing the value of PTCURR and divides the resulting difference signal by the signal representing the value of HCMDEL. A signal representing the absolute value of the resulting quotient is determined by causing the polarity indicating bit of the quotient signal to be equal to zero and comparing the resulting absolute value signal with a signal representing the value of DBAND. Thus, a determination is made as to whether the most recent peak value for the half cycle under consideration differs from the immediately preceding peak value of the half cycle, and the signal representing the resulting difference is divided by a signal representing the amplitude associated with the size of each bin in the matrix.

If operation 87 indicates that the signal representing the absolute value of the resulting quotient, which is in terms of a fraction of bin magnitude, is equal to or greater than a predetermined signal representing the dead band, the program advances to operations 88 and 89 which are performed in sequence and involve assigning the determined peak value to a row and column position in the matrix. To this end, during operation 88, the row position of the most recently determined peak value is determined by subtracting the signal representing the peak value PTCRM2 from the signal representing the minimum value entered into the matrix, HCMMIN, and dividing the resulting difference signal by a signal representing the amplitude range associated with each bin in the matrix, HCMDEL. The resulting quotient signal is truncated and incremented by one to determine the row position in the matrix for the half cycle which occurred before detection of the half cycle associated with the peak value PTCURR. These operations are represented by:

$$IROW = IFIX\left(\frac{PTCRM2 - HCMMIN}{HCMDEL}\right) + 1$$

Upon completion of operation 88, the program advances to operation 89, where the position in the column for the previously considered half cycle is determined as:

$$ICOL = IFIX\left(\frac{PTCRM1 - HCMMIN}{HCMDEL}\right) + 1$$

In other words, the position in the column is determined by subtracting the signal representing the minimum data value in the matrix HCMMIN, from the signal representing the detected peak value, PTCCRM1, and dividing the difference signal by the signal having a value associated with the size of a bin in the matrix, HCMDEL. The resulting quotient signal is incremented by one to determine the position in the column of the matrix of the half cycle completed prior to detection of PTCURR.

Upon completion of operation 89 or in response to operation 87 indicating that the currently handled peak value signal does not exceed the dead band signal magnitude, the program advances to operation 91. In operation 91 the values of the antepenultimate and immediately preceding peak value signals are updated, i.e., signal PTCRM2 is set equal to the value of sogma; PTCRM1 determined during the presently considered cycle and the value of signal PTCRM1 is set equal to the value of signal PTCURR for the presently considered cycle. Upon completion of operation 91, the program advances to operation 92, where it is in a rest state, awaiting a call from operation 85.

During operations 88 and 89 the values of the row and column bin position for one peak value of the half cycle being processed is determined. Each bin position in the matrix is provided with a counter that is addressed in response to the signal values IROW and ICOL determined during operations 88 and 89. The counter addressed by signals IROW and ICOL is incremented by one. Thus, there is an accumulation in the bin position counters of the total number of half cycles having the detected maximum and minimum peak values over the processing interval of processor 41, as described supra in connection with the method. After all of the data undulations for a particular interval have been processed the addressed counters are scanned and the accumulated signal values stored therein are read out in sequence to graphics terminal display 45 for presentation on x-y display 46.

Processor 41 is also programmed by methods well known to those skilled in the art, to sum the signals representing the accumulated values in the addressed counters together, as indicated supra in connection with the methods forming the various histograms.

While there have been described and illustrated several specific embodiments of the invention, it will be clear that variations in the details of the embodiments specifically illustrated and described may be made without departing from the true spirit and scope of the invention as defined in the appended claims.

I claim:

1. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, accumulating the variations having like initial and final peak values so an indication of the accumulated variations is displayed on the coordinate positions of the display, the display having discrete values in the first and second directions associated with different initial and final peak values, whereby a series of bins is formed in the first and second directions, the coordinate positions in the first and second directions being substantially determined by assigning each variation to an individual bin, the variations being accumulated by summing the number of variations assigned to each bin, each bin having a dead band associated with it, and in response to first and second adjacent like directed variations being associated with the same bin except for one of the values of the second variation differing from a corresponding value of the first variation by an amount less than the dead band assigning the second variation to the same bin as the first variation.

2. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the display having discrete values in the first and second directions associated with different initial and final peak values, whereby a series of bins is formed in the first and second directions, the coordinate positions in the first and second directions being substantially determined by assigning each variation to an individual bin, the variations being accumulated by summing the number of variations assigned to each bin, the display including null and reference level diagonals at 45° to each of the coordinate directions and at right angles to each other, whereby each variation is displaced from the null diagonal by an amount associated with the amplitude of the variation and is displaced from the reference level diagonal by an amount associated with the mean value of the variation, accumulating the values in the bins displaced a like amount from the null diagonal for each bin distance from the null diagonal, accumulating the values in the bins displaced a like amount from the reference level diagonal for each bin distance from the reference level diagonal, and displaying indications of the accumulated diagonal values.

3. The method of claim 1 or 2 wherein distances along the coordinate directions are proportional to peak values of the variations, the variations being assigned in proportion to the peak values.

4. The method of claim 1 or 2 wherein the undulating data have main variations with maximum oppositely directed consecutive peak values on opposite polarity sides of a reference value and subordinate variations including a false peak value and intermediate oppositely directed consecutive peak values between the maximum consecutive peak values, the false peak having a value equal to the value of an intermediate peak and occurring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

5. The method of claim 1 or 2 wherein distances along the coordinate directions are proportional to a total statistical function of the displayed data, each variation being assigned in proportion to the fraction that the variation contributes to the total statistical function.

6. The method of claim 5 wherein the statistical function is standard deviation.

7. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the display having discrete values in the first and second directions associated with different initial and final peak values, whereby a series of bins is formed in the first and second directions, the coordinate positions in the first and second directions being substantially determined by assigning each variation to an individual bin, the variations being accumulated by summing the number of variations assigned to each bin, the display including null and reference level diagonals at 45° to each of the coordinate directions and at right angles to each other, whereby each variation is displaced from the null diagonal by an amount associated with the amplitude of the variation and is displaced from the reference level diagonal by an amount associated with the mean value of the variation, accumulating the values in the bins displaced a like amount from the reference level diagonal for each bin distance from the reference level diagonal, and displaying indications of the accumulated diagonal values.

8. The method of claim 7 wherein the undulating data have main variations with maximum oppositely directed consecutive peak values on opposite polarity sides of a reference value and subordinate variations including a false peak value and intermediate oppositely directed consecutive peak values between the maximum consecutive peak values, the false peak having a value equal to the value of an intermediate peak and occurring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

9. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the display having discrete values in the first and second directions associated with different initial and final peak values, whereby a series of bins is formed in the first and second directions, the coordinate positions in the first and second directions being substantially determined by assigning each variation to an individual bin, the variations being accumulated by summing the number of variations assigned to each bin, the display including null and reference level diagonals at 45° to each of the coordinate directions and at right angles to each other, whereby each variation is displaced from the null diagonal by an amount associated with the amplitude of the variation and is displaced from the reference level diagonal by an amount associated with the mean value of the variation, accumulating the values in the bins displaced a like amount from the null diagonal for each bin distance from the null diagonal, and displaying indications of the accumulated diagonal values.

10. The method of claim 2, 7 or 9 further including deriving an indication of the accumulated values in the bins displaced by bins numbered k and (k+1) from the null diagonal, where k equals every odd integer from 1 to N/2, and N equals the number of bins in the display along the reference level diagonal.

11. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the display including null and reference level diagonals at 45° to each of the coordinate directions and at right angles to each other, whereby each variation is displaced from the null diagonal by an amount associated with the amplitude of the variation and is displaced from the reference level diagonal by an amount associated with the mean value of the variation, summing the accumulated variations at positions displaced a like amount from the null diagonal for each position displaced from the null diagonal, and summing the accumulated variations at positions displaced a like amount from the reference level diagonal for each position displaced from the reference level diagonal.

12. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the display including null and reference level diagonals at 45° to each of the coordinate directions and at right angles to each other, whereby each variation is displaced from the null diagonal by an amount associated with the amplitude of the variation and is displaced from the reference level diagonal by an amount associated with the mean value of the variation, and summing the accumulated variations at positions displaced a like amount from the reference level diagonal for each position displaced from the reference level diagonal.

13. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the display including null and reference level diagonals at 45° to each of the coordinate directions and at right angles to each other, whereby each variation is displaced from the null diagonal by an amount associated with the amplitude of the variation and is displaced from the reference level diagonal by an amount associated with the mean value of the variation, and summing the accumulated variations at positions displaced a like amount from the null diagonal for each position displaced from the null diagonal.

14. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the display including null and reference level diagonals at 45° to each of the coordinate directions and at right angles to each other, whereby each variation is displaced from the null diagonal by an amount associated with the amplitude of the variation and is displaced from the reference level diagonal by an amount associated with the mean value of the variation, separately summing the accumulated variations at like coordinate positions in one coordinate direction on each side of the null diagonal, and indicating the summed accumulated variations.

15. The method of claim 1, 2, 7, 9, 11, 12, 13 or 14 wherein the oppositely detected peak values are detected by reading the peak values from a chart containing the data with a digitizing tablet that derives digital signals indicative of the values of the read peak values, supplying the derived digital signals to a digital processor that assigns the variations to the coordinate positions and derives the signals that are displayed.

16. The method of claim 1, 2, 7, 9, 11, 12, 13 or 14 wherein the oppositely detected peak values are detected by transducing a stored indication of the data into an analog signal, converting the stored signal into a first digital signal indicative of the data, supplying the first digital signal to a digital signal processor that derives second digital signals indicative of the values of the peak values and which responds to the peak value signals to assign the variations to the coordinate positions and derives signals that are displayed.

17. The method of claim 1, 2, 7, 9, 11, 12, 13 or 14 wherein the oppositely detected peak values are detected by real time converting the data into a first digital signal indicative of the data, supplying the first digital signal to a digital signal processor that derives second digital signals indicative of the values of the peak values and which responds to the peak value signals to assign the variations to the coordinate positions and derives signals that are displayed.

18. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, distances along the coordinate directions being proportional to a total statistical function of the displayed data, each variation being assigned in proportion to the fraction that the variation contributes to the total statistical function.

19. The method of claim 18 wherein the undulating data have main variations with maximum oppositely directed consecutive peak values on opposite polarity sides of a reference value and subordinate variations including a false peak value and intermediate oppositely directed consecutive peak values between the maximum consecutive peak values, the false peak having a value equal to the value of an intermediate peak and occurring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

20. The method of claim 18 wherein the display has discrete values in the first and second directions associated with different initial and final peak values, whereby a series of bins is formed in the first and second directions, the coordinate positions in the first and second directions being substantially determined by assigning each variation to an individual bin, the variations being accumulated by summing the number of variations assigned to each bin.

21. The method of claim 18 or 20 wherein the statistical function is standard deviation.

22. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the oppositely detected peak values being detected by reading the peak values from a chart containing the data with a digitizing tablet that derives digital signals indicative of the values of the read peak values, and supplying the derived digital signals to a digital processor that assigns the variations to the coordinate positions and derives the signals that are displayed.

23. The method of claim 22 wherein the display has discrete values in the first and second directions associated with different initial and final peak values, whereby a series of bins is formed in the first and second directions, the coordinate positions in the first and second directions being substantially determined by assigning each variation to an individual bin, the variations being accumulated by summing the number of variations assigned to each bin.

24. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the oppositely detected peak values being detected by transducing a stored indication of the data into an analog signal, converting the stored signal into a first digital signal indicative of the data, and supplying the first digital signal to a digital signal processor that derives second digital signals indicative of the values of the peak values and which responds to the peak value signals to assign the variations to the coordinate positions and derives signals that are displayed.

25. The method of claim 24 wherein the display has discrete values in the first and second directions associated with different initial and final peak values, whereby a series of bins is formed in the first and second directions, the coordinate positions in the first and second directions being substantially determined by assigning each variation to an individual bin, the variations being accumulated by summing the number of variations assigned to each bin.

26. A method of indicating characteristics of undulating data having variations with oppositely directed peak values, the characteristics being indicated on a display having first and second mutually orthogonal coordinate directions, comprising the steps of determining the oppositely directed consecutive peak values of each variation, assigning each variation to a coordinate position on the display, the coordinate position in the first and second directions being respectively determined by the initial and final peak values of the variation, and accumulating the variations having like initial and final peak values so an indication of the accumulated variations is displayed on the coordinate positions of the display, the oppositely detected peak values being detected by real time converting the data into a first digital signal indicative of the data, and supplying the first digital signal to a digital signal processor that derives second digital signals indicative of the values of the peak values and which responds to the peak value signals to assign the variations to the coordinate positions and derives signals that are displayed.

27. The method of claim 26 wherein the display has discrete values in the first and second directions associated with different inital and final peak values, whereby a series of bins is formed in the first and second directions, the coordinate positions in the first and second directions being substantially determined by assigning each variation to an individual bin, the variations being accumulated by summing the number of variations assigned to each bin.

28. Apparatus for indicating characteristics of undulating data having variations with detected oppositely directed consecutive peak values, comprising a display having first and second mutually orthogonal coordinate directions, means responsive to the detected peak values for assigning each variation a coordinate position on the display, the coordinate position in the first and second directions being respectively determined by the initial and final peak values of the variation, means for accumulating the variations having like initial and final peak values so an indication of the accumulated variations is displayed on the coordinate positions of the display, the display having discrete values in the first and second directions associated with different initial and final peak values, whereby a series of bins is formed in the first and second directions, the assigning means including means for substantially assigning each variation to an individual bin, the means for accumulating including means for accumulating the number of variations assigned to each bin, each bin having a dead band associated with it, and means responsive to first and second adjacent variations being associated with the same bin except for one of the values of the second variation differing from a corresponding value of the first variation by an amount less than the dead band for assigning the second variation to the same bin as the first variation.

29. Apparatus for indicating characteristics of undulating data having variations with detected oppositely directed consecutive peak values, comprising a dislay having first and second mutually orthogonal coordinate directions, means responsive to the detected peak values for assigning each variation a coordinate position on the display, the coordinate position in the first and second directions being respectively determined by the inital and final peak values of the variation, means for accumulating the variations having like initial and final peak values so an indication of the accumulated variations is displayed on the coordinate positions of the display, the display having discrete values in the first and second directions associated with different initial and final peak values, whereby a series of bins is formed in the first and second directions, the assigning means including means for substantially assigning each variation to an individual bin, the means for accumulating including means for accumulating the number of variations assigned to each bin, the display including null and reference level diagonals at 45° to each of the coordinate directions and at right angles to each other whereby each variation is displaced from the null diagonal by an amount associated with the amplitude of the variation and is displaced with the mean value of the variation, means for accumulating the values in the bins displaced a like amount from the null diagonal for each bin distance from the null diagonal, means for accumulating the values in the bins displaced a like amount from the reference level diagonal for each bin distance from the reference level diagonal, and means for displaying indications of the accumulated diagonal values.

30. The apparatus of claim 28, or 29 wherein distances along the coordinate directions are proportional to peak values of the variations, the assigning means including means for assigning the variations in proportion to the peak values.

31. The apparatus of claim 30 wherein the undulating data have main variations with maximum oppositely directed consecutive peak values on opposite polarity sides of a reference value and subordinate variations including a false peak value and intermediate oppositely directed consecutive peak values between the maximum consecutive peak values, the false peak having a value equal to the value of an intermediate peak and occurring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

32. The apparatus of claim 28 or 29 wherein each bin has a dead band associated with it, and means responsive to first and second adjacent variations being associated with the same bin except for one of the values of the second variation differing from a corresponding value of the first variation by an amount less than the dead band for assigning the second variation to the same bin as the first variation, means for detecting a total statistical function of the displayed data, means responsive to the detected total statistical function for establishing proportionality values for displayed variations along the coordinate directions, the means for assigning including means for assigning each variation in proportion to the fraction that the variation contributes to the total statistical function.

33. The apparatus of claim 32 wherein the undulating data have main variations with maximum oppositely directed consecutive peak values on opposite polarity sides of a reference value and subordinate variations including a false peak value and intermediate oppositely directed consecutive peak values between the maximum consecutive peak values, the false peak having a value equal to the value of an intermediate peak and occurring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

34. The apparatus of claim 32 wherein the statistical function is standard deviation.

35. The apparatus of claim 28 or 29 wherein each bin has a dead band associated with it, and means responsive to first and second adjacent variations being associated with the same bin except for one of the values of the second variation differing from a corresponding value of the first variation by an amount less than the dead band for assigning the second variation to the same bin as the first variation, the display having discrete values in the first and second directions associated with different initial and final peak values, whereby a series of bins is formed in the first and second directions, the assigning means including means for substantially assigning each variation to an individual bin, the means for accumulating including means for accumulating the number of variations assigned to each bin, the undulating data having main variations with maximum oppositely directed consecutive peak values on opposite polarity sides of a reference value and subordinate variations including a false peak value and intermediate oppositely directed consecutive peak values between the maimum consecutive peak values, the false peak having a value equal to the value of an intermediate peak and occuring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

36. Apparatus for indicating characteristics of undulating data having variations with detected oppositely directed consecutive peak values, comprising a display having first and second mutually orthogonal coordinate directions, means responsive to the detected peak values for assigning each variation a coordinate position on the display, the coordinate position in the first and second directions being respectively determined by the initial and final peak values of the variation, means for accumulating the variations having like initial and final peak values so an indication of the accumulated variations is displayed on the coordinate positions of the display, the display having discrete values in the first and second directions associated with different initial and final peak values, whereby a series of bins is formed in the first and second directions, the assigning means including means for substantially assigning each variation to an individual bin, the means for accumulating including means for accumulating the number of variations assigned to each bin, the display including null and reference level diagonals at 45° to each of the coordinate directions and at right angles to each other whereby each variation is displaced from the null diagonal by an amount associated with the amplitude of the variation and is displaced from the reference level diagonal by an amount associated with the mean value of the variation, means for accumulating the values in the bins displaced a like amount from the reference level diagonal for each bin distance from the reference level diagonal, and means for displaying indications of the accumulated diagonal values.

37. Apparatus for indicating characteristics of undulating data having variations with detected oppositely directed consecutive peak values, comprising a display having first and second mutually orthogonal coordinate directions, means responsive to the detected peak values for assigning each variation a coordinate position on the display, the coordinate position in the first and second directions being respectively determined by the initial and final peak values of the variation, and means for accumulating the variations having like initial and final peak values so an indication of the accumulated variations is displayed on the coordinate positions of the display, the display having discrete values in the first and second directions associated with different initial and final peak values, whereby a series of bins is formed in the first and second directions, the assigning means including means for substantially assigning each variation to an individual bin, the means for accumulating including means for accumulating the number of variations assigned to each bin, the display including null and reference level diagonals at 45° to each of the coordinate directions and at right angles to each other whereby each variation is displaced from the null diagonal by an amount associated with the amplitude of the variation and is displaced from the reference level diagonal by an amount associated with the mean value of the variation, means for accumulating the values in the bins displaced a like amount from the null diagonal for each bin distance from the null diagonal, and means for displaying indications of the accumulated diagonal values.

38. The apparatus of claim 29, 36 or 37 further including means for deriving an indication of the accumulated values in the bins displaced by k and (k+1) from the null diagonal, where k equals every odd integer from 1 to N/2, and N equals the number of bins in the display along the referenced level diagonal.

39. Apparatus for indicating characteristics of undulating data having variations with detected oppositely directed consecutive peak values, comprising a display having first and second mutually orthogonal coordinate directions, means responsive to the detected peak values for assigning each variation a coordinate position on the display, the coordinate position in the first and second directions being respectively determined by the initial and final peak values of the variation, means for accumulating the variations having like initial and final peak values so an indication of the accumulated variations is displayed on the coordinate positions of the display, the display including null and reference level diagonals at 45° to each of the coordinate directions and at right angles to each other whereby each variation is displaced from the null diagonal by an amount associated with the amplitude of the variation and is displaced from the reference level diagonal by an amount associated with the mean value of the variation, means for summing the accumulated variations at positions displaced a like amount from the null diagonal and for each position displaced from the null diagonal and for summing the accumulated variations at positions displaced a like amount from the reference level diagonal for each position displaced from the reference level diagonal.

40. Apparatus for indicating characteristics of undulating data having variations with detected oppositely directed consecutive peak values, comprising a display having first and second mutually orthogonal coordinate directions, means responsive to the detected peak values for assigning each variation a coordinate position on the display, the coordinate position in the first and second directions being respectively determined by the initial and final peak values of the variation, means for accumulating the variations having like initial and final peak values so an indication of the accumulated variations is displayed on the coordinate positions of the display, the display including null and reference level diagonals at 45° to each of the coordinate directions and at right angles to each other whereby each variation is displaced from the null diagonal by an amount associated with the amplitude of the variation and is displaced from the reference level diagonal by an amount associated with the means value of the variation, means for summing the accumulated variations at positions displaced a like amount from the reference level diagonal for each position displaced from the reference level diagonal, and means for indicating the summed accumulated variations.

41. Apparatus for indicating characteristics of undulating data having variations with detected oppositely directed consecutive peak values, comprising a display having first and second mutually orthogonal coordinate directions, means responsive to the detected peak values for assigning each variation a coordinate position on the display, the coordinate position in the first and second directions being respectively determined by the initial and final peak values of the variation, means for accumulating the variations having like initial and final peak values so an indication of the accumulated variations is displayed on the coordinate positions of the display, the display including null and reference level diagonals at 45° to each of the coordinate directions and at right angles to each other whereby each variation is displaced from the null diagonal by an amount associated with the amplitude of the variation and is displaced from the reference level diagonal by an amount associated with the mean value of the variation, means for summing the accumulated variations at positions displaced a like amount from the null diagonal for each position displaced from the null diagonal, and means for indicating the summed accumulated variations.

42. Apparatus for indicating characteristics of undulating data having variations with detected oppositely directed consecutive peak values, comprising a display having first and second mutually orthogonal coordinate directions, means responsive to the detected peak values for assigning each variation a coordinate position on the display, the coordinate position in the first and second directions being respectively determined by the initial and final peak values of the variation, means for accumulating the variations having like initial and final peak values so an indication of the accumulated variations is displayed on the coordinate positions of the display, the display including null and reference level at diagonal at 45° to each of the coordinate directions and at right angles to each other whereby each variation is displaced from the null diagonal by an amount associated with the amplitude of the variation and is displaced from the reference level diagonal by an amount associated with the mean value of the variation, means for separately summing the accumulated variations at like coordinate positions in one coordinate direction of each side of the null diagonal, and means for indicating the summed accumulated variations.

43. The apparatus of claim 28, 29, 36, 37, 39, 40, 41 or 42 further including means responsive to the undulating data for deriving a signal indicative of the detected peak value.

44. The appparatus of claim 43 wherein the means for deriving the peak value indicating signal includes a digital to analog converter responsive to the undulating data for deriving a digital signal indicative of the undulations, and digital processing means responsive to the digital signal indicative of the undulations.

45. Apparatus for indicating characteristics of undulating data having variations with detected oppositely directed consecutive peak values comprising a display having first and second mutually orthogonal coordinate directions, means responsive to the detected peak values for assigning each variation a coordinate position on the display, the coordinate position in the first and second directions being respectively determined by the initial and final peak values of the variation, means for accumulating the variations having like initial and final peak values so an indication of the accumulated variations is displayed on the coordinate positions of the display, means for detecting a total statistical function of the displayed data, means responsive to the detected total statistical function for establishing proportionality values for displayed variations along the coordinate directions, the means for assigning including means for assigning each variation in proportion to the fraction that the variation contributes to the total statistical function.

46. The apparatus of claim 45 wherein the display has discrete values in the first and second directions associated with different initial and final peak values, whereby a series of bins is formed in the first and second directions, the assigning means including means for substantially assigning each variation to an individual bin, the means for accumulating including means for accumulating the number of variations assigned to each bin.

47. The apparatus of claim 46 wherein the undulating data have main variations with maximum oppositely directed consecutive peak values on opposite polarity sides of a reference value and subordinate variations including a false peak value and intermediate oppositely directed consecutive peak values between the maximum consecutive peak values, the false peak having a value equal to the value of an intermediate peak and occurring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

48. The apparatus of claim 46 wherein the statistical function is standard deviation.

49. The apparatus of claim 45 wherein the undulating data have main variations with maximum oppositely directed consecutive peak values on opposite polarity side of a reference value and subordinate variations including a false peak value and intermediate oppositely directed consecutive peak values between the maximum consecutive peak values, the false peak having a value equal to the value of an intermediate peak and occurring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

50. The apparatus of claim 45 wherein the statistical function is standard deviation.

51. Apparatus for indicating characteristics of undulating data having variations with detected oppositely directed consecutive peak values, comprising a display having first and second mutually orthogonal coordinate directions, means responsive to the detected peak values for assigning each variation a coordinate position on the display, the coordinate position in the first and second directions being respectively determined by the initial and final peak values of the variation, means for accumulating the variations having like initial and final peak values so an indication of the accumulated variations is displayed on the coordinate positions of the display, the undulating data having main variations with maximum oppositely directed consecutive peak values on opposite polarity sides of a reference value and subordinate variations including a false peak value and intermediate oppositely directed consecutive peak values between the maximum consective peak values, the false peak having a value equal to the value of an intermediate peak and occurring between the two maximum peaks, each main variation between the maximum consecutive peak values being detected and assigned to a coordinate position as a variation in accordance with the maximum consecutive peak values, each subordinate variation being detected and assigned as a variation to coordinate positions in accordance with one of the false peak values and an intermediate peak value or in accordance with a pair of adjacent intermediate peak values.

* * * * *